US009078382B2

(12) United States Patent
Shoji et al.

(10) Patent No.: US 9,078,382 B2
(45) Date of Patent: Jul. 7, 2015

(54) METHOD OF PRODUCING CIRCUIT BOARD

(75) Inventors: Takashi Shoji, Kawasaki (JP);
Takekazu Sakai, Yokohama (JP)

(73) Assignee: SHOW A DENKO K.K., Tokyo (JP)

( * ) Notice: Subject to any disclaimer, the term of this patent is extended or adjusted under 35 U.S.C. 154(b) by 924 days.

(21) Appl. No.: 13/266,310

(22) PCT Filed: Apr. 27, 2010

(86) PCT No.: PCT/JP2010/003028
§ 371 (c)(1),
(2), (4) Date: Oct. 26, 2011

(87) PCT Pub. No.: WO2010/125809
PCT Pub. Date: Nov. 4, 2010

(65) Prior Publication Data
US 2012/0042515 A1    Feb. 23, 2012

(30) Foreign Application Priority Data

Apr. 28, 2009  (JP) ................. 2009-109931
Apr. 7, 2010   (JP) ................. 2010-088807

(51) Int. Cl.
*H05K 3/00*  (2006.01)
*H01R 9/00*  (2006.01)
(Continued)

(52) U.S. Cl.
CPC ......... *H05K 3/3436* (2013.01); *Y10T 29/49146* (2015.01); *H05K 3/282* (2013.01);
(Continued)

(58) Field of Classification Search
CPC ... H05K 3/3436; H05K 3/3484; H05K 3/282; H05K 3/3452; H05K 2203/124; H05K 2201/10234; H05K 2201/10674; H05K 2203/0425; H05K 2203/043; H05K 3/3489

USPC ............. 29/830, 842, 843, 846, 851, 852; 174/256; 228/180.22; 257/690, 737, 257/738; 361/760, 768, 820; 438/613–615
See application file for complete search history.

(56) References Cited

U.S. PATENT DOCUMENTS 5,982,629 A * 11/1999 Shoji et al. ............ 228/180.22
6,066,551 A *  5/2000 Satou et al. ............... 438/615
(Continued)

FOREIGN PATENT DOCUMENTS

EP    0595343 A2   5/1994
EP    1900471 A1   3/2008
(Continued)

OTHER PUBLICATIONS

Office Action with a mailing date of Dec. 22, 2012 for corresponding TW Application No. 099113492.
(Continued)

*Primary Examiner* — Donghai D Nguyen
(74) *Attorney, Agent, or Firm* — Sughrue Mion, PLLC

(57) ABSTRACT

The present invention has been made in consideration of the above-described situation, and provides a method of producing a circuit board that can bond a component to be mounted without slanting the component, and simplify the steps. The method of producing a circuit board includes forming a first adhesive layer by applying a first adhesiveness-imparting compound on the surface of terminal portions of a circuit board; attaching a core body on the first adhesive layer of the terminal portions; forming a second adhesive layer by applying a second adhesiveness-imparting compound on the surface of the core body; attaching first solder particles on the second adhesive layer of the surface of the core body; and forming a solder layer on the surface of the core body by melting the first solder particles.

20 Claims, 8 Drawing Sheets

(51) Int. Cl.
*H05K 3/34* (2006.01)
*H05K 3/28* (2006.01)

(52) U.S. Cl.
CPC ........... *H05K 3/3452* (2013.01); *H05K 3/3484*
(2013.01); *H05K 3/3489* (2013.01); *H05K 2201/10234* (2013.01); *H05K 2201/10674* (2013.01); *H05K 2203/0425* (2013.01); *H05K 2203/043* (2013.01); *H05K 2203/124* (2013.01)

(56) References Cited

U.S. PATENT DOCUMENTS

| | | |
|---|---|---|
| 2002/0047216 A1 | 4/2002 | Jiang et al. |
| 2008/0012131 A1 | 1/2008 | Tanaka |

FOREIGN PATENT DOCUMENTS

| | | |
|---|---|---|
| JP | 07-007244 A | 1/1995 |
| JP | 7-074459 A | 3/1995 |
| JP | 7-288255 A | 10/1995 |
| JP | 2004-179188 A | 6/2004 |
| JP | 2004-282062 A | 10/2004 |
| JP | 2007-036082 A | 2/2007 |
| JP | 2008-041803 A | 2/2008 |
| WO | 2008016128 A1 | 2/2008 |

OTHER PUBLICATIONS

Extended European Search Report dated Sep. 17, 2012 for corresponding European Patent Application No. EP 10 76 9509.

\* cited by examiner

METHOD OF PRODUCING CIRCUIT BOARD

TECHNICAL FIELD

The present invention relates to a method of producing a circuit board.

Priorities are claimed on Japanese Patent Application No. 2009-109931, filed on Apr. 28, 2009, and on Japanese Patent Application No. 2010-088807, filed on Apr. 7, 2010, the contents of which are incorporated herein by reference.

BACKGROUND ART

In recent years, as means for forming an electronic circuit, a method of providing a circuit pattern on a plastic board, a ceramic board, or an insulating board coated with plastic or the like, and bonding electronic components such as IC elements, semiconductor chips, resists, and condensers onto the circuit pattern by soldering is widely used.

Among the means, in a method of bonding a lead terminal of the electronic component to a predetermined portion of the circuit pattern, steps of forming a thin solder layer in advance on the surface of a conductive circuit electrode on the board, printing a solder paste or a flux on the thin solder layer, loading and positioning a predetermined electronic component, and melting and solidifying the solder by causing the thin solder layer or the thin solder layer and the solder paste to reflow are sequentially performed in general.

In recent years, along with the miniaturization of electronic products and circuit boards, electronic components are required to have a fine pitch. As the electronic components, for example, a QFP (Quad Flat Package) with a pitch of 0.3 mm, a CSP (Chip Size Package), an FC (Flip Chip) with a pitch of 0.15 mm, and an LSI chip having a BGA structure are known. In addition, as a method of mounting the electronic components on the circuit board, a method of superimposing solder bumps formed in the electronic components on solder bumps formed in the circuit board and causing the bumps to reflow is known. In this method, solder bumps having a fine pattern shape that can respond to the fine pitch of the electronic components are required.

As a method of forming solder bumps on the circuit board, electroplating, non-electrolytic plating, a method of printing a paste of solder powder and causing the paste to reflow, and the like are known. However, in a method of producing the solder bump by the non-electrolytic plating, it is difficult to make the solder layer thick, and in a method of producing the solder bump by the electroplating, it is difficult to apply electric currents for plating to a complex circuit. In addition, in the method of printing the solder paste, it is difficult to respond to a fine pitch pattern. In these circumstances, as a method of forming solder bumps having a constant and uniform height, a method of attaching solder balls to a circuit is used.

As the method of attaching solder balls to a circuit, a method of imparting adhesiveness by allowing an adhesive-imparting compound to react with the surface of a conductive circuit electrode of a circuit board and attaching solder powder to the adhesive layer is known. After this method, the circuit board is heated, whereby solder bumps are formed (see Patent Document 1). In addition, as an application of this method, a technique of attaching only one solder powder particle to a necessary portion has also been developed (see Patent Document 2).

CITATION LIST

Patent Literature

[Patent Document 1] Japanese Unexamined Patent Application, Publication No. 7-7244
[Patent Document 2] Japanese Unexamined Patent Application, Publication No. 2008-41803

DISCLOSURE OF INVENTION

However, in a case where the height of the solder bump is high as in the BGA structure, when a chip and the circuit board are connected by reflow, the molten solder bump is easily crushed. Moreover, there is a concern that the chip may sink unevenly and be bonded in a slanted state.

On the contrary, a method of forming solder bumps by temporarily melting solder balls having a high melting point at a high temperature and then connecting the electronic components to the circuit board by solder having a melting point lower than the melting point of the solder balls is currently used. In addition, a method of using balls (copper core solder balls) formed of metal such as copper and plated with solder is also known. The copper core solder balls are arranged and temporarily melted so as to form solder bumps, and the solder bumps are caused to reflow after electronic components are mounted. In this manner, the core bodies serve as spacers, and it is possible to maintain a constant distance between the electronic components and the circuit board.

However, materials of the high melting point solder are limited, and currently, a high melting point solder with a composition including a high level of lead is used. Moreover, currently, the commercialized high melting point solder includes 95% or 80% lead, which is a high level of lead. Accordingly, there is a serious problem in that an α ray emitted from a lead isotope causes the malfunction of LSI and the like. Therefore, there is a demand for a 100% lead-free high melting point solder.

The method of using the copper core solder ball has problems in that it is technically difficult to evenly attach the solder to the ball of copper core, and that the production cost is markedly high. Consequently, this method has not been widely used yet.

The present invention has been made in consideration of the above situation, and an object thereof is to provide a method of producing a circuit board that can bond electronic components without slanting the electronic components and simplify the steps.

In order to solve the above problems, the present inventor carried out a thorough investigation, thereby completing the present invention. That is, the present invention is:

[1] A method of producing a circuit board including steps of: forming a first adhesive layer by applying a first adhesiveness-imparting compound on the surface of terminal portions of a circuit board; attaching a core body on the first adhesive layer of the terminal portions; forming a second adhesive layer by applying a second adhesiveness-imparting compound on the surface of the core body; attaching first solder particles on the second adhesive layer of the surface of the core body; and forming a solder layer on the surface of the core body by melting the first solder particles.

[2] The method of producing a circuit board according to [1], further including steps of forming the first adhesive layer by applying the first adhesiveness-imparting compound on the surface of the terminal portions; attaching the first solder particles-attached core body to the first adhesive layer, wherein the first solder particles-attached core body is the core body in which the first solder particles are attached to the surface thereof through the second adhesive layer; and forming the solder layer on the surface of the core body by melting the first solder particles.

[3] The method of producing a circuit board according to [1], further including a step of attaching second solder particles to the surface of the terminal portion through the first adhesive layer, after the step of attaching the first solder particles to the second adhesive layer, wherein in the step of forming the solder layer, the first and second solder particles are melted.

[4] The method of producing a circuit board according to [1], further including a step of attaching second solder particles to the surface of the terminal portion through the first adhesive layer, between the step of attaching the core body to the first adhesive layer and forming the second adhesive layer, wherein in the step of forming the solder layer, the first and second solder particles are melted.

[5] The method of producing a circuit board according to [1], further including attaching a step of second solder particles to the surface of the terminal portion, before the step of forming the first adhesive layer, wherein in the step of forming the solder layer, the first and second solder particles are melted.

[6] The method of producing a circuit board according to [1], further including steps of attaching second solder particles to the surface of the terminal portion; forming a solder film on the surface of the terminal portion by melting the second solder particles; and forming the first adhesive layer by applying the first adhesiveness-imparting compound to the surface of the terminal portion through the solder film, wherein in the step of forming the solder layer, the first solder particles and the solder film are melted.

[7] The method of producing a circuit board according to [1], further including steps of forming the solder film on the surface of the terminal portion by plating; and forming the first adhesive layer by applying the first adhesiveness-imparting compound to the surface of the terminal portion through the solder film, wherein in the step of forming the solder layer, the first solder particles and the solder film are melted.

[8] The method of producing a circuit board according to [3], wherein the average particle size of the second solder particles is from 1 μm to 0.4 times the average particle size of the first solder particles.

[9] The method of producing a circuit board according to [4] or [5], wherein the average particle size of the second solder particles is from 1 μm to 0.5 times the average particle size of the core body and is smaller than the first solder particles.

[10] The method of producing a circuit board according to [9], wherein the average particle size of the second solder particles is 5 μm to 10 μm.

[11] The method of producing a circuit board according to [6], wherein the average particle size of the second solder particles is from 1 μm to a third of the diameter of the terminal portion.

[12] The method of producing a circuit board according to [7], wherein the solder film is formed into a thickness of about 3 μm.

[13] The method of producing a circuit board according to any one of [1] and [3] to [12], wherein the circuit board having the first adhesive layer is dipped into a dispersion including the core body so that the core body is attached to the first adhesive layer.

[14] The method of producing a circuit board according to [2], wherein the circuit board having the first adhesive layer is dipped into a dispersion including the first solder particles-attached core body so that the first solder particles-attached core body is attached to the first adhesive layer.

[15] The method of producing a circuit board according to any one of [1] and [3] to [13], wherein the circuit board to which the core body having the second adhesive layer has been attached is dipped into a dispersion including the first solder particles so that the first solder particles are attached to the surface of the core body.

[16] The method of producing a circuit board according to [2] or [14], wherein the core body having the second adhesive layer is dipped into the dispersion including the first solder particles, so that the first solder particles are attached to the second adhesive layer and the first solder particle-attached core body is formed.

[17] The method of producing a circuit board according to any one of [1] to [16], wherein a metal ball is used as the core body.

[18] The method of producing a circuit board according to any one of [1] to [17], wherein the core body is formed of copper.

[19] The method of producing a circuit board according to any one of [1] to [18], wherein in the step of forming the first adhesive layer, an insulating layer having an opening portion for exposing the terminal portion is formed on the circuit board, and then the first adhesive layer is formed.

According to the production method of the present invention, after the core body is attached to the terminal portion, the first solder particles are attached to the core body through the second adhesive layer, and the first solder particles are heated and melted, whereby the solder layer is formed on the surface of the core body. Accordingly, this production method can greatly simplify the steps, compared to a case of using a solder-attached core body having a solder layer formed on the surface thereof by plating or the like. Moreover, since the core body serves as a spacer when an electronic component or the like is mounted, it is possible to mount the electronic component or the like without slanting the posture of the component.

In addition, according to the production method of the present invention, after the first solder particles-attached core body is attached to the terminal portion, the solder layer is formed on the surface of the core body by heating and melting of the first solder particles. Accordingly, this production method can greatly simplify the steps, compared to a case of using a solder-attached core body having a solder layer formed on the surface thereof by plating or the like. Moreover, since the core body serves as a spacer when an electronic component or the like is mounted, it is possible to mount the electronic component or the like without slanting the posture of the component.

As a result, according to the present invention, it is possible to provide a method of producing a circuit board that can bond a component to be mounted without slanting the component, and simplify the steps.

DETAILED DESCRIPTION OF THE INVENTION

First Embodiment

Figure 1:
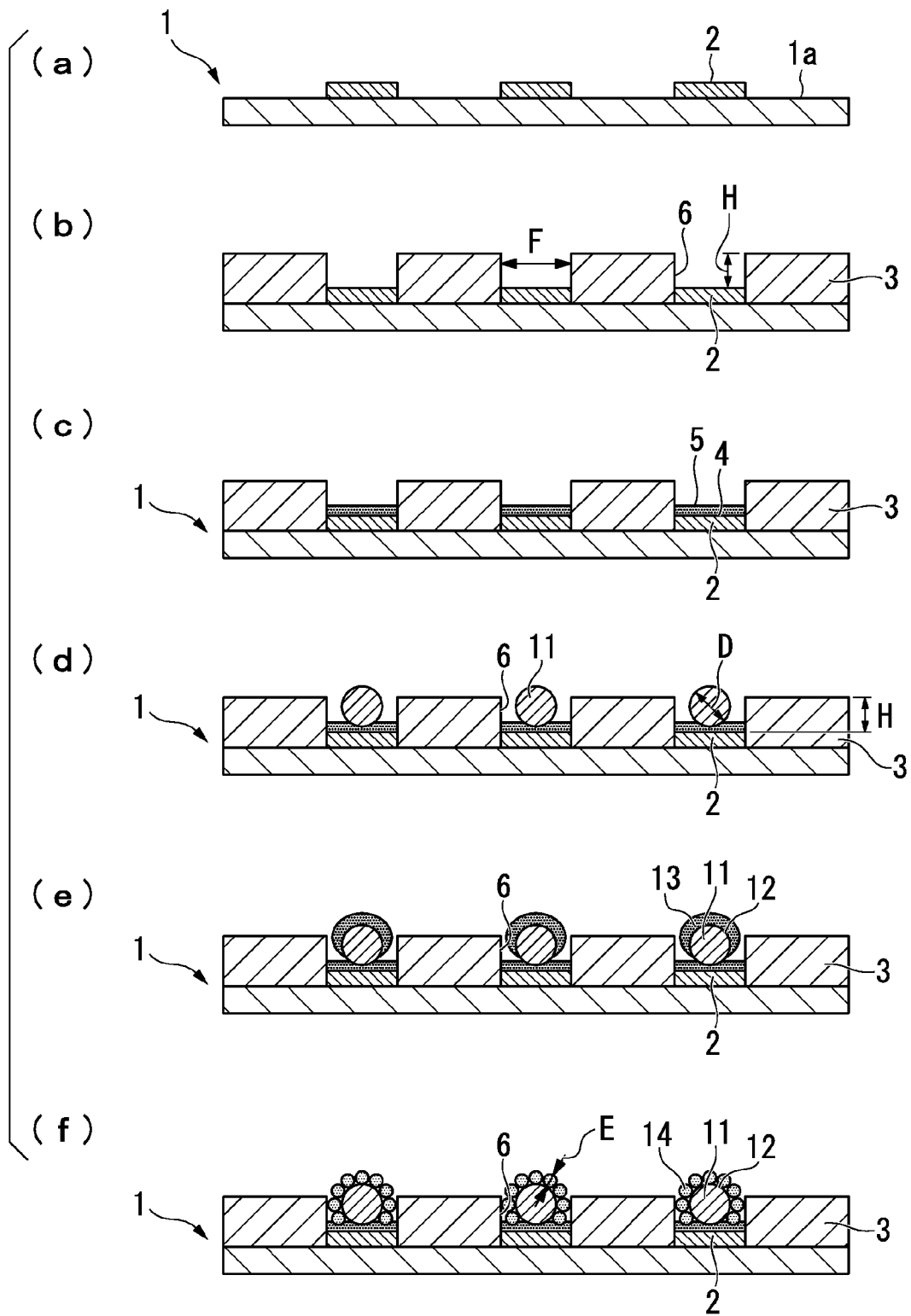
FIG. 1 is a process drawing illustrating a process of producing a circuit board that is a first embodiment of the present invention.
Figure 2:
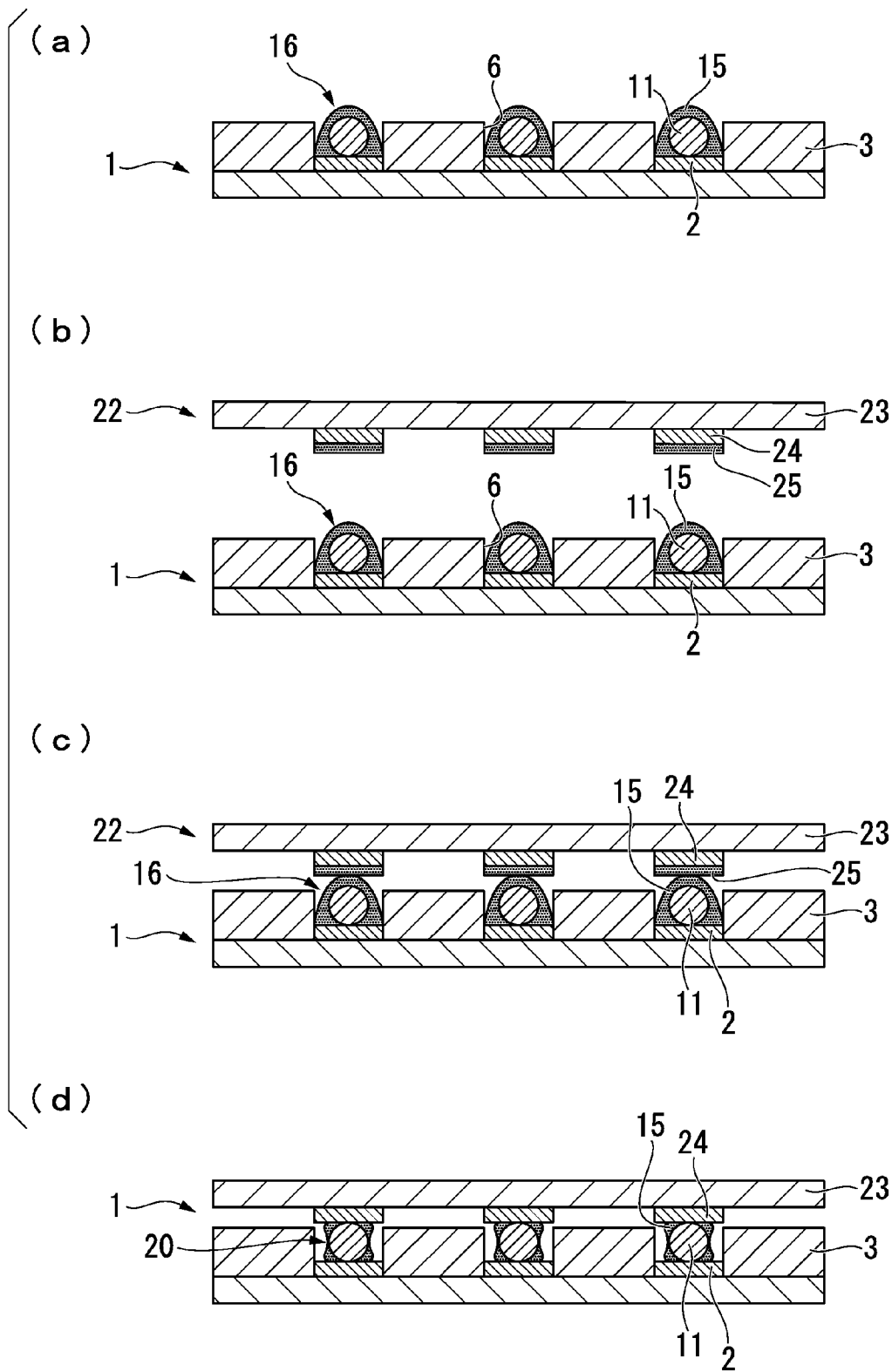
FIG. 2 is a process drawing illustrating the process of producing a circuit board that is the first embodiment of the present invention.

Hereinafter, a method of producing a circuit board that is the first embodiment of the present invention will be described with reference to drawings. FIGS. 1 and 2 are process drawings illustrating the method of producing a circuit board of the present embodiment.

The method of producing a circuit board of the present embodiment is schematically configured with steps of forming a first adhesive layer 5 on a terminal portion 2 of a circuit board 1, attaching a core body 11 to the first adhesive layer 5, attaching first solder particles 14 to the surface of the core body 11, and forming a solder layer 15 by melting the first solder particles 14. Hereinafter, desirable embodiments of the respective steps will be described in detail.

Examples of the circuit board 1 as a subject of the invention include a board that is obtained by laminating a metal plate on a plastic board, a plastic film board, a glass fabric board, a paper-based epoxy resin board, a ceramic board, and the like, or a single-sided circuit board, a double-sided circuit board, a multilayered circuit board, or a flexible circuit board in which a circuit pattern is formed using a conductive material such as a metal on an insulating board that is obtained by covering a metal substrate with plastic, ceramics, and the like. In addition, the circuit board 1 can also be applied to an IC board, a condenser, a resist, a coil, a varistor, a bare chip, a wafer, and the like.

FIG. 1(a) is a cross-sectional view of the circuit board 1 used in the present embodiment. Examples of the circuit board 1 include a ceramic board.

In an upper surface 1a of the circuit board 1, a circuit pattern (terminal portion 2) formed of copper or a copper alloy is formed, for example. Hereinafter, a step of forming the first adhesive layer 5 on a surface 4 of the terminal portion 2 will be described.

First, as shown in FIG. 1(b), the periphery of the terminal portion 2 is surrounded by a resist (insulating layer) 3 in advance, thereby forming an opening portion 6. Specifically, a resist layer 3 is formed on the entire upper surface 1a on the circuit board 1, followed by exposure and development to harden the resist layer 3, thereby forming the opening portion 6. The opening portion 6 serves as a configuration exposing the terminal portion 2. A diameter F of the opening portion 6 is appropriately set according to a diameter D of the core body 11.

The resist layer 3 can use an insulating resist that is generally used for the production of a circuit board. There is no limitation on the material of the resist layer 3, as long as the material has a property of not expressing adhesiveness in a step of imparting the first adhesive layer 5, which will be described later.

As the material of the terminal portion 2, copper or a copper alloy can be used. However, the present invention is not limited thereto, and materials other than the above ones can also be used as long as the materials are conductive materials that can obtain adhesiveness by an adhesiveness-imparting material in steps described later. Examples of the material include materials including flash gold, Ni, Sn, Ni—Au, Pd, Ag, a solder alloy, and the like.

A depth H (a difference between the level of the surface 4 of the terminal portion 2 and the level of the upper surface of the resist layer 3) of the opening portion 6 is appropriately set according to a particle size D of the core body 11. At this time, it is desirable that the level difference H be set to smaller than the particle size D of the core body 11. If the level difference H is larger than the particle size D, a bump 16 is not normally formed in some cases, which is thus not preferable. The level difference H in which the level of the electrode surface is higher than that of the resist surface may be in a negative range as long as the core body is held by adhesive force so as not to be detached in the step described later. However, in consideration of the workability of the steps and the function of the core body, the level difference H is more preferably in a range from 1 μm to a half of the particle size D. If the level difference H is in this range, it is possible to stably prevent the detachment of the core body 11 and to form the solder bump 16 having a sufficient height, in the steps described later. Although it is desirable that the opening portion 6 have a circular shape, the opening portion 6 can have an oval shape or a square shape.

Next, as shown in FIG. 1(c), the first adhesive layer 5 is formed. First, among first adhesiveness-imparting compounds shown below, at least one or two or more kinds of compounds are dissolved in water or acidic water, and the pH thereof is preferably adjusted to slight acidity of about pH 3 to 4. As a result, an adhesive solution is formed. Subsequently, by dipping the circuit board 1 in the adhesive solution, or by applying the adhesive solution to the circuit board 1, the first adhesive layer 5 is formed on the surface 4 of the terminal portion 2.

Herein, as the first adhesiveness-imparting compound, it is possible to use a naphthotriazole-based derivative, a benzotriazole-based derivative, an imidazole-based derivative, a benzimidazole-based derivative, a mercaptobenzothiazole-based derivative, benzothiazolethio fatty acid, and the like. These adhesiveness-imparting compounds have a strong effect particularly on copper, and can also impart adhesiveness to other conductive materials.

The benzotriazole-based derivative that is suitably used in the present invention is represented by General Formula (1).

[Chem. 1]

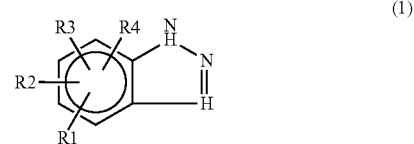

Here, in Formula (1), R1 to R4 are independently a hydrogen atom, an alkyl group with 1 to 16 (preferably 5 to 16) carbon atoms, an alkoxy group, F, Br, Cl, I, a cyano group, an amino group, or an OH group.

The naphthotriazole-based derivative that is suitably used in the present invention is represented by General Formula (2).

[Chem. 2]

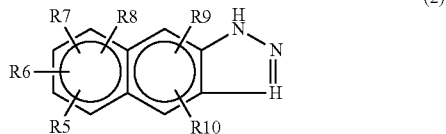

Here, in Formula (2), R5 to R10 are independently a hydrogen atom, an alkyl group with 1 to 16 (preferably 5 to 16) carbon atoms, an alkoxy group, F, Br, Cl, I, a cyano group, an amino group, or an OH group.

The imidazole-based derivative that is suitably used in the present invention is represented by General Formula (3).

[Chem. 3]

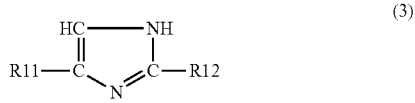

Here, in Formula (3), R11 and R12 are independently a hydrogen atom, an alkyl group with 1 to 16 (preferably 5 to 16) carbon atoms, an alkoxy group, F, Br, Cl, I, a cyano group, an amino group, or an OH group.

The benzimidazole-based derivative that is suitably used in the present invention is represented by General Formula (4).

[Chem. 4]

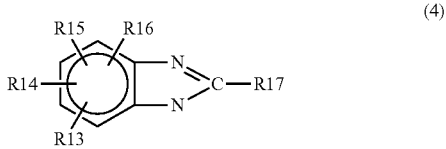

Here, in Formula (4), R13 to R17 are independently a hydrogen atom, an alkyl group with 1 to 16 (preferably 5 to 16) carbon atoms, an alkoxy group, F, Br, Cl, I, a cyano group, an amino group, or an OH group.

The mercaptobenzothiazole-based derivative that is suitably used in the present invention is represented by General Formula (5).

[Chem. 5]

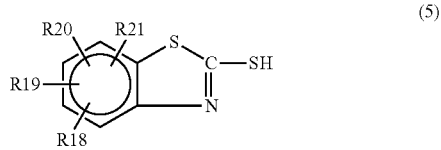

Here, in Formula (5), R18 to R21 are independently a hydrogen atom, an alkyl group with 1 to 16 (preferably 5 to 16) carbon atoms, an alkoxy group, F, Br, Cl, I, a cyano group, an amino group, or an OH group.

The benzothiazolethio fatty acid that is suitably used in the present invention is represented by General Formula (6).

[Chem. 6]

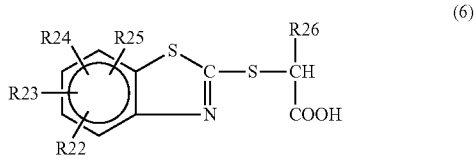

Here, in Formula (6), R22 to R26 are independently a hydrogen atom, an alkyl group with 1 to 16 (preferably 1 or 2) carbon atoms, an alkoxy group, F, Br, Cl, I, a cyano group, an amino group, or an OH group.

Among these compounds, in the benzotriazole-based derivative represented by General Formula (1), the more carbon atoms included in R1 to R4, the stronger the adhesiveness is in general.

In addition, in R11 to R17 of the imidazole-based derivative and the benzimidazole-based derivative that are represented by General Formulae (3) and (4) respectively, the more carbon atoms, the stronger the adhesiveness is.

In the benzothiazolethio fatty acid derivative that is represented by General Formula (6), R22 to R26 preferably include 1 or 2 carbon atoms.

Examples of a material used for adjusting pH of the adhesive solution include inorganic acids such as hydrochloric acid, sulfuric acid, nitric acid, and phosphoric acid. In addition, as organic acids, formic acid, lactic acid, acetic acid, propionic acid, malic acid, oxalic acid, malonic acid, succinic acid, and tartaric acid can be used.

There is no limitation on the concentration of the first adhesiveness-imparting compound in the adhesive solution, and the concentration may be appropriately adjusted for use according to the solubility and the usage situation. The concentration is particularly preferably in a range of 0.05% by mass to 20% by mass based on the whole adhesive solution. If the concentration of the first adhesiveness-imparting compound is in this range, it is possible to impart sufficient adhesiveness to the terminal portion 2. On the other hand, if the concentration is less than 0.05% by mass based on the whole adhesive solution, the sufficient adhesiveness fails to be imparted, and if the concentration exceeds 20% by mass based on the whole adhesive solution, a large amount of the adhesiveness-imparting compound is consumed, which is inefficient and thus not preferable.

The treatment temperature at the time when the adhesiveness is imparted to the terminal portion 2 is preferably slightly higher than room temperature. In this manner, the formation rate of the first adhesive layer 5 and the amount of the first adhesive layer 5 formed become sufficient. The optimal treatment temperature varies depending on the concentration of the adhesiveness-imparting compound and the type of the material metal of the terminal portion 2, but is preferably in a range from 30° C. to 60° C. in general. It is preferable to adjust other conditions so that the dipping time of the circuit board in the adhesive solution is in a range from 5 seconds to 5 minutes.

It is preferable that 50 ppm to 1000 ppm of copper coexist as ions in the adhesive solution. If the copper ions coexist in the amount of this range, the formation efficiency such as the formation rate of the first adhesive layer 5 and the amount of the first adhesive layer 5 formed can be heightened.

The formation method of the adhesive layer of the present embodiment can be effectively used as means for forming not only the terminal portion of the circuit board but also the solder bump portion for bonding LSI itself, that is, the bump of an LSI chip including BGA, CSP (chip size package), LSI, and the like. In addition, these components are naturally included in the circuit board 1 of the present invention.

Next, as shown in FIG. 1(*d*), the core body 11 is attached onto the terminal portion 2 through the first adhesive layer 5. The method thereof will be described hereinafter. At this time, as a method of attaching the core body 11 to the first adhesive layer 5, there is a method of directly supplying the core body 11 to the first adhesive layer 5 in the air or in an inert atmosphere, and a method of dispersing the core body 11 in a dispersion 41 to create a slurry-like state and supplying the slurry to the first adhesive layer 5, for example.

First, the method of attaching the core body 11 in the air or in an inert gas atmosphere will be described. First, the core body 11 is introduced to a container filled with air or inert gas. Thereafter, the circuit board 1 in which the first adhesive layer 5 has been formed is installed in the container, and the container is tilted or vibrated, thereby bringing the first adhesive layer 5 into contact with the core body 11. As a result, the core body 11 is attached to the first adhesive layer 5.

Figure 3:
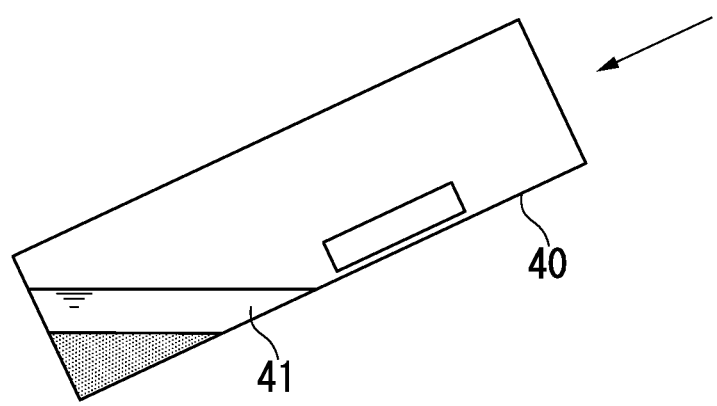
FIG. 3 is a schematic view illustrating a step of attaching first solder particles.

Next, a method of attaching the core body 11 in liquid will be described. First, as shown in FIG. 3, the dispersion 41 such as water is introduced to a container 40, and the core body 11 is added to the dispersion 41. Thereafter, the container 40 is tilted so as to tilt the dispersion 41 and the core body 11 to one side, and the circuit board 1 is installed inside the container while being kept out of contact with the dispersion 41 and the core body 11. Subsequently, the container 40 is tilted to the left and right sides, whereby the first adhesive layer 5 contacts the core body 11 in the dispersion 41. In this manner, the core body 11 is attached to the first adhesive layer 5.

In this manner, attaching the core body 11 in liquid makes it possible to prevent the core body 11 from being attached to a non-adhesive portion due to static electricity or prevent the aggregation of the core body 11 caused by the static electricity. Accordingly, the use of this method is particularly preferable when a circuit board with a high pitch and fine powder are used. The method of attaching the core body 11 is not limited to the method of attaching in liquid. Appropriate methods can be independently selected and used in the respective steps according to the condition such as the size of the core body 11.

As the material of the core body 11, copper is particularly preferable. Materials other than copper can also be used as long as the materials have a melting point higher than the melting point of the first solder particles 14 and can obtain adhesiveness by the second adhesiveness-imparting compound. Examples of the materials other than copper include materials including an alloy of Ni, Sn, Ni—Au, Au—Sn, Au—Si, and the like.

The average particle size D of the core body 11 may be appropriately selected according to the size of the terminal portion 2 to be attached, but is particularly preferably in a range from 20 μm to 200 μm.

Next, as shown in FIG. 1(*e*), a second adhesive layer 13 is formed.

As a method of forming the second adhesive layer 13, the method of forming the first adhesive layer 5 may be applied as it is. By using the same compound as the first adhesiveness-imparting compound as a second adhesiveness-imparting compound, the second adhesive layer 13 can be formed under the same conditions as those of the method of forming the first adhesive layer 5. That is, by dipping the circuit board 1 in an adhesive solution including a compound (the second adhesiveness-imparting compound) that has been adjusted in the same manner as the first adhesiveness-imparting compound, or by applying the adhesive solution to the circuit board 1, the second adhesive layer 13 can be formed so as to cover a surface 12 of the core body 11.

Thereafter, as shown in FIG. 1(*f*), the first solder particles 14 are attached to the surface 12 of the core body 11 through the second adhesive layer 13. The method thereof will be described hereinafter.

As a method of attaching the first solder particles 14 to the second adhesive layer 13, there is a method of directly supplying the first solder particles 14 to the second adhesive layer 13 in the air or in an inert gas atmosphere, and a method of dispersing the first solder particles 14 in a dispersion 41 to create a slurry-like state and supplying the slurry to the second adhesive layer 13, for example.

First, the method of attaching the first solder particles 14 in an inert gas atmosphere will be described. First, the first solder particles 14 are introduced to a container filled with air or inert gas. Thereafter, the circuit board 1 in which the second adhesive layer 13 has been formed is installed in the container. Then the container is tilted or vibrated, thereby bringing the second adhesive layer 13 into contact with the first solder particles 14. As a result, the first solder particles 14 are attached to the second adhesive layer 13.

Next, a method of attaching the first solder particles 14 in liquid will be described. First, as shown in FIG. 3, the dispersion 41 such as water is introduced to a container 40, and first solder particles 14 are added to the dispersion 41. Thereafter, the container 40 is tilted so as to tilt the dispersion 41 and the first solder particles 14 to one side, and the circuit board 1 is installed inside the container while being kept out of contact with the dispersion 41 and the first solder particles 14. Subsequently, the container 40 is tilted to the left and right sides, whereby the second adhesive layer 13 contacts the first solder particles 14 in the dispersion 41. In this manner, the first solder particles 14 are attached to the second adhesive layer 13.

The method of attaching the first solder particles 14 is not limited to the method of attaching in liquid. Appropriate methods can be independently selected and used in the respective steps according to the condition such as the size of first solder particles 14.

As the first solder particles 14, particles with a particle size smaller than a solder bump 20 and the core body 11 are used. A particle size E of the first solder particles 14 can be appropriately set according to the particle size D of the core body 11 so that a plurality of first solder particles 14 are attached to one core body 11. That is, the average particle size E of the first solder particles 14 is desirably equal to or larger than 1 μm and smaller than a half of the average particle size D of the core body 11. If the particle size E of the first solder particles 14 is in this range, it is possible to attach a plurality of first solder particles 14 to one core body 11. On the other hand, if the particle size E of the first solder particles 14 is smaller than 1 μm, the amount of solder becomes insufficient, which is thus not desirable. If the particle size E of the first solder particles 14 is equal to or larger than a half of the average particle size D of the core body 11, a sufficient amount of a plurality of first solder particles 14 cannot be attached to one core body 11, which is thus not preferable.

Examples of a metal composition of the first solder particles 14 include compositions based on Sn—Pb, Sn—Pb—Ag, Sn—Pb—Bi, Sn—Pb—Bi—Ag, and Sn—Pb—Cd. From the viewpoint of the exclusion of Pb, which is a recent viewpoint regarding industrial waste, compositions based on Sn—In, Sn—Bi, In—Ag, In—Bi, Sn—Zn, Sn—Ag, Sn—Cu, Sn—Sb, Sn—Au, Sn—Bi—Ag—Cu, Sn—Ge, Sn—Bi—Cu, Sn—Cu—Sb—Ag, Sn—Ag—Zn, Sn—Cu—Ag, Sn—Bi—Sb, Sn—Bi—Sb—Zn, Sn—Bi—Cu—Zn, Sn—Ag—Sb, Sn—Ag—Sb—Zn, Sn—Ag—Cu—Zn, and Sn—Zn—Bi, which do not include Pb, are preferable.

Examples of the above metal compositions include, based on a eutectic solder (hereinafter, represented as 63 Sn/37 Pb) including 63% by mass of Sn and 37% by mass of Pb, 62 Sn/36 Pb/2 Ag, 62.6 Sn/37 Pb/0.4 Ag, 60 Sn/40 Pb, 50 Sn/50 Pb, 30 Sn/70 Pb, 25 Sn/75 Pb, 10 Sn/88 Pb/2 Ag, 46 Sn/8 Bi/46 Pb, 57 Sn/3 Bi/40 Pb, 42 Sn/42 Pb/14 Bi/2 Ag, 45 Sn/40 Pb/15 Bi, 50 Sn/32 Pb/18 Cd, 48 Sn/52 In, 43 Sn/57 Bi, 97 In/3 Ag, 58 Sn/42 In, 95 In/5 Bi, 60 Sn/40 Bi, 91 Sn/9 Zn, 96.5 Sn/3.5 Ag, 99.3 Sn/0.7 Cu, 95 Sn/5 Sb, 20 Sn/80 Au, 90 Sn/10 Ag, 90 Sn/7.5 Bi/2 Ag/0.5 Cu, 97 Sn/3 Cu, 99 Sn/1 Ge, 92 Sn/7.5 Bi/0.5 Cu, 97 Sn/2 Cu/0.8 Sb/0.2 Ag, 95.5 Sn/3.5 Ag/1 Zn, 95.5 Sn/4 Cu/0.5 Ag, 52 Sn/45 Bi/3 Sb, 51 Sn/45 Bi/3 Sb/1 Zn, 85 Sn/10 Bi/5 Sb, 84 Sn/10 Bi/5 Sb/1 Zn, 88.2 Sn/10 Bi/0.8 Cu/1 Zn, 89 Sn/4 Ag/7 Sb, 88 Sn/4 Ag/7 Sb/1 Zn, 98 Sn/1 Ag/1 Sb, 97 Sn/1 Ag/1 Sb/1 Zn, 91.2 Sn/2 Ag/0.8 Cu/6 Zn, 89 Sn/8 Zn/3 Bi, 86 Sn/8 Zn/6 Bi, 89.1 Sn/2 Ag/0.9 Cu/8 Zn, and the like. As the first solder particles 14 used in the present embodiment, two or more kinds of the first solder particles having different compositions can be used in combination.

Subsequently, fixing of the core body 11 and the first solder particles 14 is performed. The fixing is a reaction in which the constituent materials of the terminal portion 2 are diffused toward the first solder particles 14 side between the terminal portion 2 and the first solder particles 14. As the reaction proceeds, the core body 11 and the first solder particles 14 are fixed to each other. The fixing temperature is preferably in a range from the melting point of solder −50° C. to the melting point of solder +50° C., and more preferably in a range from the melting point of solder −30° C. to the melting point of solder +30° C. If the fixing temperature is in this range, the first solder particles 14 are not melted, or even if the inside of the first solder particles 14 is melted, the molten portion does not flow out of the particles due to the effect of an oxide film on the surface. Accordingly, it is possible to perform the fixing while maintaining the shape of the first solder particles 14.

Thereafter, a water-soluble flux is applied to the circuit board 1. As the water-soluble flux, a flux disclosed in JP-A-2004-282062 can be used, for example. The use of the water-soluble flux makes it possible to remove the oxide film on the surface of the first solder particles 14 and the surface 4 of the terminal portion 2.

Next, a reflow step shown in FIG. 2(a) is performed, thereby forming the solder bump 16. The method thereof will be described hereinafter.

First, the circuit board 1 is dried, followed by the reflow step, thereby melting the first solder particles 14. At this time, the heating temperature is preferably in a range from 200° C. to 300° C., and particularly desirably in a range from the melting point +10° C. to the melting point +50° C. If heating is performed at these temperatures, the molten solder of the first solder particles 14 sufficiently reacts with the surface 4 of the terminal portion 2 or the surface 12 of the core body 11, whereby it is possible to form a diffusion layer.

As a result, the first solder particles 14 are melted and spread over the whole surface 12 of the core body 11. Consequently, the terminal portion 2 and the core body 11 are firmly connected to each other, and an electronic component 22 to be mounted and the core body 11 are stably connected to each other. After this reflow step, the circuit board 1 is washed with water, thereby removing the residual flux. In this manner, the solder bump 16 is formed on the terminal portion 2.

Next, as shown in FIGS. 2(b) to 2(d), the electronic component 22 is mounted on the circuit board 1. The method thereof will be described hereinafter.

First, as shown in FIG. 2(b), a terminal portion 24 is set to the position of the solder bump 16, thereby disposing the electronic component 22 on the circuit board 1. The electronic component 22 is schematically configured with an electronic component body 23 and the terminal portions 24. The terminal portions 24 are provided in one side of the electronic component body 23, and a plating portion 25 is formed on the surface of the terminal portion 24.

Subsequently, the electronic component 22 is mounted on the circuit board 1, and the plating portion 25 is brought into contact with the solder layer 15. This state is shown in FIG. 2(c). Thereafter, as shown in FIG. 2(d), the reflow step is performed so as to melt the solder layer 15, thereby soldering the terminal portion 24 and the terminal portion 2. In this manner, the electronic component 22 is mounted on the circuit board 1.

According to the method of producing the circuit board 1 of the present embodiment, the core body 11 serves as a spacer; accordingly, it is possible to maintain a constant distance between the electronic component 22 and the circuit board 1. Therefore, the problem that the mounted electronic component 22 unevenly sinks into the circuit board 1 can be solved, and it is possible to obtain the circuit board 1 that has a constant height with respect to the terminal portion 2 and a high reliability. In addition, since the first solder particles 14 are attached to the core body 11 through the second adhesive layer 13, the expensive copper solder balls are not used. Consequently, it is possible to realize the cost reduction and the simplification of the steps. Moreover, since it is not necessary to use the high melting point solder that includes a high level of lead, it is also possible to solve the problem of the malfunction caused by the α ray emitted from a Pb isotope. The production method of the present embodiment is a method suitable for a fine circuit board, and can provide an electronic instrument having a high degree of integration and high reliability.

Since the first adhesive layer 5 is formed after the resist layer 3 having the opening portions 6 formed on the circuit board 1, the first adhesive layer 5 is not formed on portions other than the terminal portion 2. As a result, it is possible to selectively attach the core body 11 to the terminal portion 2. In addition, since the core body 11 is attached to the inside of the opening portion 6, even when the adhesive force of the first adhesive layer 5 is weak, it is possible to prevent the core body 11 from being detached outside the opening portion 6. Consequently, it is possible to reliably attach the core bodies 11 to all terminal portions 2.

By attaching the core body 11 to the first adhesive layer 5 in the dispersion 41 including the core body 11, it is possible to attach a uniform amount of the core body 11 to the respective terminal portion 2. As a result, for example, it is also possible to reliably attach one core body 11 to one terminal portion 2.

Moreover, by attaching the first solder particles 14 to the second adhesive layer 13 in the dispersion 41 including the first solder particles 14, it is possible to attach a uniform amount of the first solder particles 14 to the respective core body 11.

The use of the metal ball as the core body 11 makes it possible to secure conduction between the electronic component 22 and the terminal portion 2. Particularly, when the core body 11 is formed of copper, the conduction is secured, and the second adhesive layer 13 is easily formed.

Second Embodiment

Hereinafter, the method of producing the circuit board 1 as a second embodiment of the present invention will be described with reference to drawings.

Figure 4:
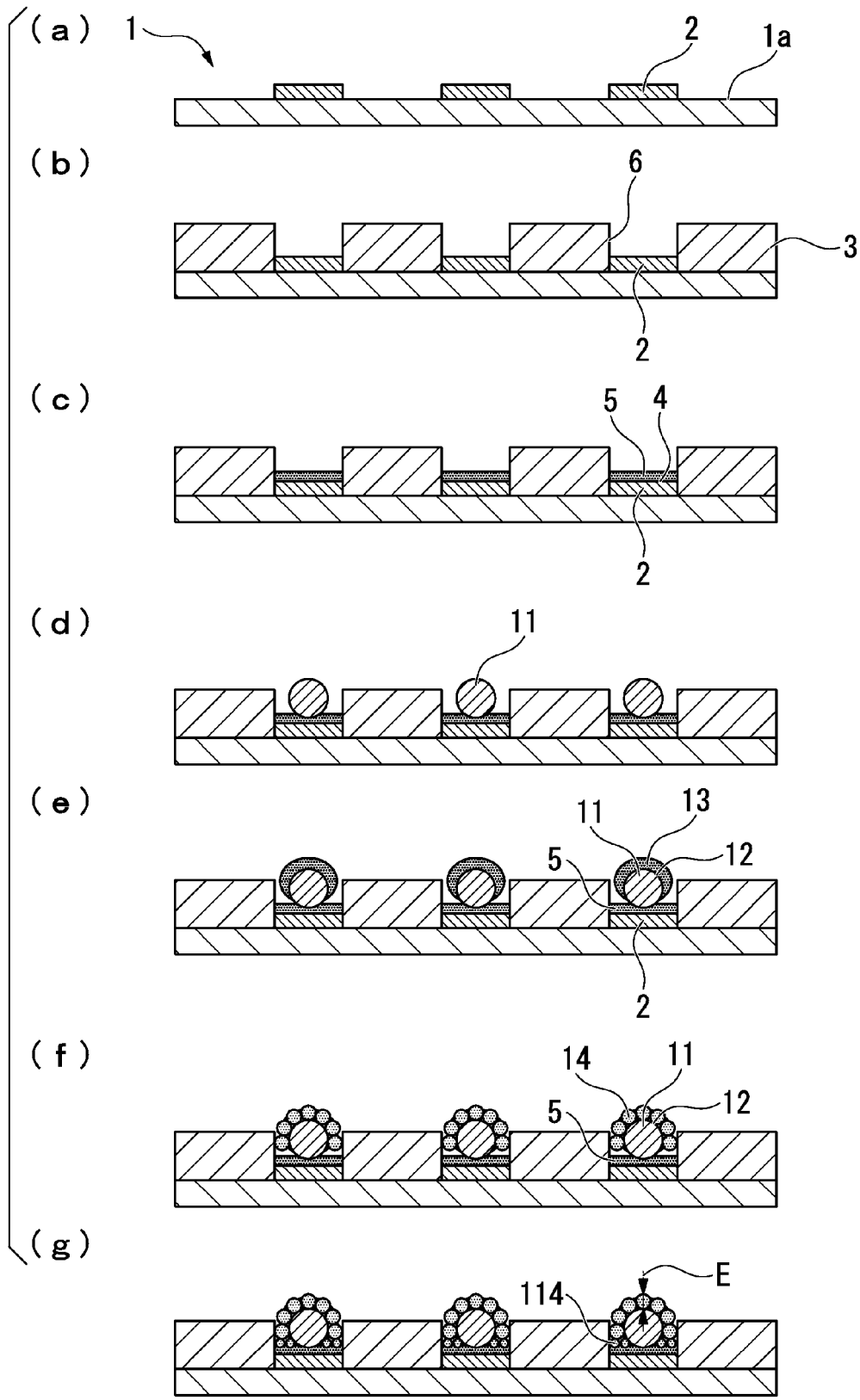
FIG. 4 is a process drawing illustrating a process of producing a circuit board that is a second embodiment of the present invention.

The present embodiment is different from the first embodiment in that after the first solder particles 14 are attached to the surface 12 of the core body 11 through the second adhesive layer 13, second solder particles 114 are attached to the first adhesive layer 5, as shown in FIG. 4(g). Hereinafter, the detailed description thereof will be made.

First, as shown in FIGS. 4(a) to 4(f), the first solder particles 14 are attached to the surface 12 of the core body 11 through the second adhesive layer 13. The steps performed to this point are the same as those in the first embodiment, so the detailed descriptions thereof will be omitted herein.

Next, as shown in FIG. 4(g), the second solder particles 114 are attached to the first adhesive layer 5. Since the attaching method is the same as the method of attaching the core body 11, which was described earlier, the detailed description thereof will be omitted. At this time, the average particle size of the second solder particles 114 is desirably from 1 μm to 0.4 times the average particle size E of the first solder particles 14. If the particle size of the second solder particles 114 is in this range, a sufficient amount of the second solder particles 114 can enter in between the first solder particles 14 and the first adhesive layer 5.

On the other hand, if the particle size of the second solder particles 114 is smaller than 1 μm, the molten solder is not sufficiently spread between the core body 11 and the terminal portion 2 in the next reflow step. If the particle size of the second solder particles 114 exceeds 0.4 times the average particle size E of the first solder particles 14, the molten solder spreads too much between the core body 11 and the terminal portion 2 in the next reflow step, or the second solder particles do not enter a predetermined position, which is not preferable since the solder bump 16 described later shows variations in its size.

Next, the core body 11, the first solder particles 14 and the second solder particles 114 are fixed. Thereafter, the first solder particles 14 and the second solder particles 114 are melted by reflow, thereby forming the solder layer 15. Subsequently, the same steps as those in the first embodiment are performed, thereby producing the circuit board 1 of the present embodiment.

According to the method of producing the circuit board 1 of the present embodiment, after the first solder particles 14 are attached to the surface 12 of the core body 11 through the second adhesive layer 13, the second solder particles 114 that are smaller than the first solder particles 14 are attached to the terminal portion 2 through the first adhesive layer 5. As a result, it is possible to cause the second solder particles 114 to enter a gap between the core body 11 and the terminal portion 2. Therefore, it is possible to reliably connect the core body 11 to the terminal portion 2 in the reflow step.

Third Embodiment

Hereinafter, the method of producing the circuit board 1 as the third embodiment of the present invention will be described with reference to drawings.

Figure 5:
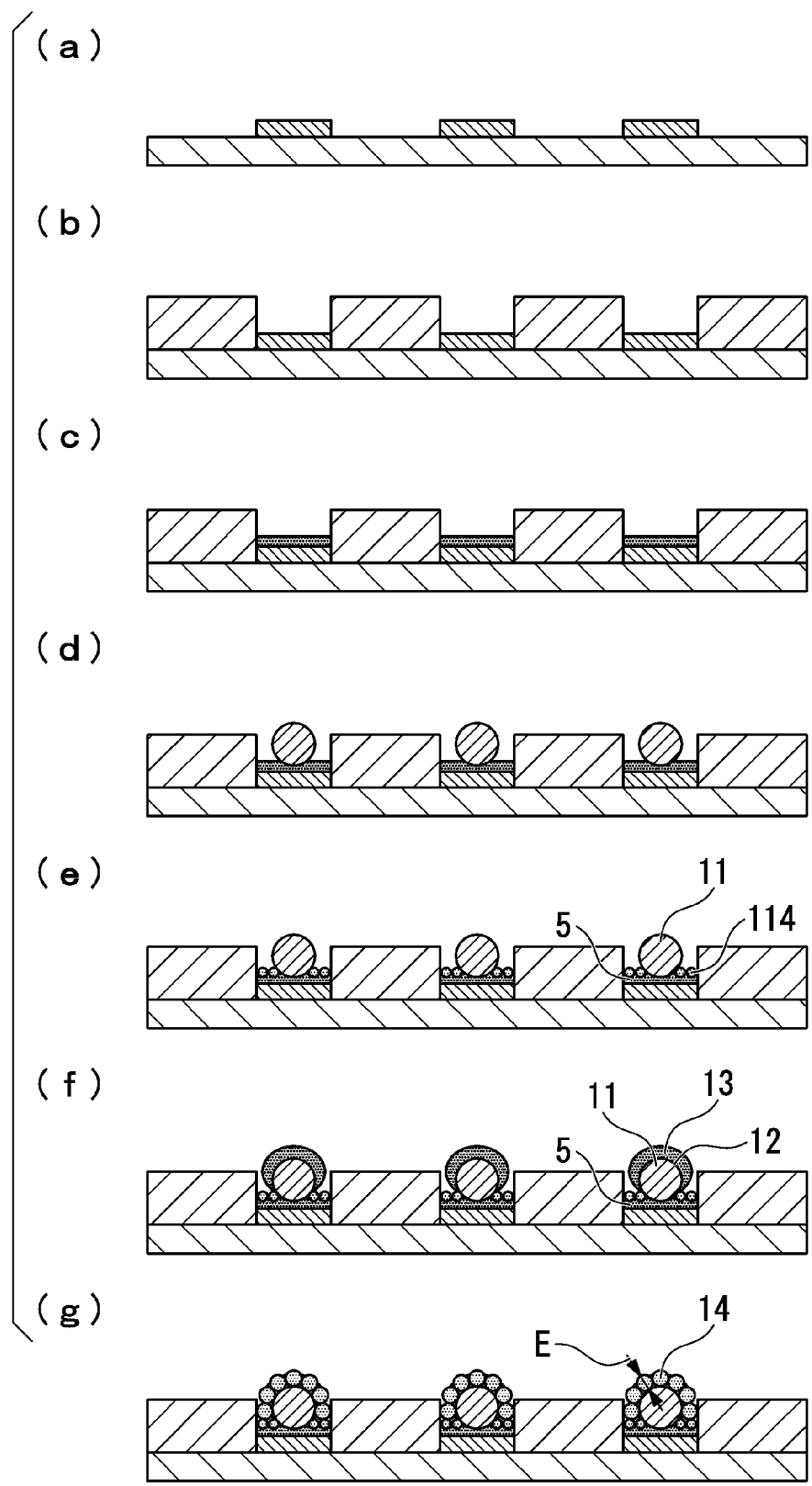
FIG. 5 is a process drawing illustrating a process of producing a circuit board that is a third embodiment of the present invention.

The present embodiment is different from the first embodiment in that after the core body 11 is attached onto the terminal portion 2 through the first adhesive layer 5, the second solder particles 114 are attached to the first adhesive layer 5, as shown in FIG. 5(e). Hereinafter, the detailed descriptions thereof will be made.

First, as shown in FIGS. 5(a) to 5(d), the core body 11 is attached to the first adhesive layer 5. The steps performed to this point are the same as those in the first embodiment, so the detailed descriptions thereof will be omitted herein.

Next, as shown in FIG. 5(e), the second solder particles 114 are attached to the first adhesive layer 5. Since the attaching method is the same as the method of attaching the core body 11, which was described earlier, the detailed description thereof will be omitted herein.

At this time, the average particle size of the second solder particles 114 is from 1 μm to 0.5 times the average particle size D of the core body 11, desirably smaller than the average particle size E of the first solder particles 14, and preferably in a range from 5 μm to 10 μm. If the particle size of the second solder particles 114 is in this range, a sufficient amount of the second solder particles 114 can enter in between the first solder particles 14 and the first adhesive layer 5.

At this time, the second solder particles 114 having different particle sizes can be classified according to the particle size and attached to the first adhesive layer 5. In this manner, it is possible to uniformly cover the first adhesive layer 5 with the second solder particles 114.

On the other hand, if the particle size of the second solder particles 114 is smaller than 1 μm, the molten solder is not sufficiently spread between the core body 11 and the terminal portion 2 in the next reflow step. If the particle size of the second solder particles 114 exceeds 0.5 times the average particle size E of the first solder particles 14, the molten solder spreads too much between the core body 11 and the terminal portion 2 in the next reflow step, which is not preferable since the solder bump 16 described later shows variations in its size.

Next, as shown in FIG. 5(f), the second adhesive layer 13 is formed so as to cover the core body 11 and the second solder particles 114. The method of forming the second adhesive layer 13 is the same as that in the first embodiment, so the detailed description thereof will be omitted herein.

Thereafter, as shown in FIG. 5(g), the first solder particles 14 are attached to the surface 12 of the core body 11 through the second adhesive layer 13.

Next, the core body 11, the first solder particles 14, and the second solder particles 114 are fixed. Thereafter, the first solder particles 14 and the second solder particles 114 are melted by reflow, thereby forming the solder layer 15. Subsequently, the same steps as those in the first embodiment are performed, thereby forming the circuit board 1 of the present embodiment.

According to the method of producing the circuit board 1 of the present embodiment, after the core body 11 is attached to the terminal portion 2 through the first adhesive layer 5, the second solder particles 114 that are smaller than the first solder particles 14 are attached to the terminal portion 2. As a result, it is possible to cause the second solder particles 114 to enter a gap between the core body 11 and the terminal portion 2. In addition, in this step, since the second solder particles 114 are fixed to each other by the fixing step, it is possible to stably attach all of the second solder particles 114 to the terminal portion 2. Consequently, it is possible to reliably connect the core body 11 to the terminal portion 2 in the reflow step.

Fourth Embodiment

Hereinafter, the method of producing the circuit board 1 as the fourth embodiment of the present invention will be described with reference to drawings.

Figure 6:
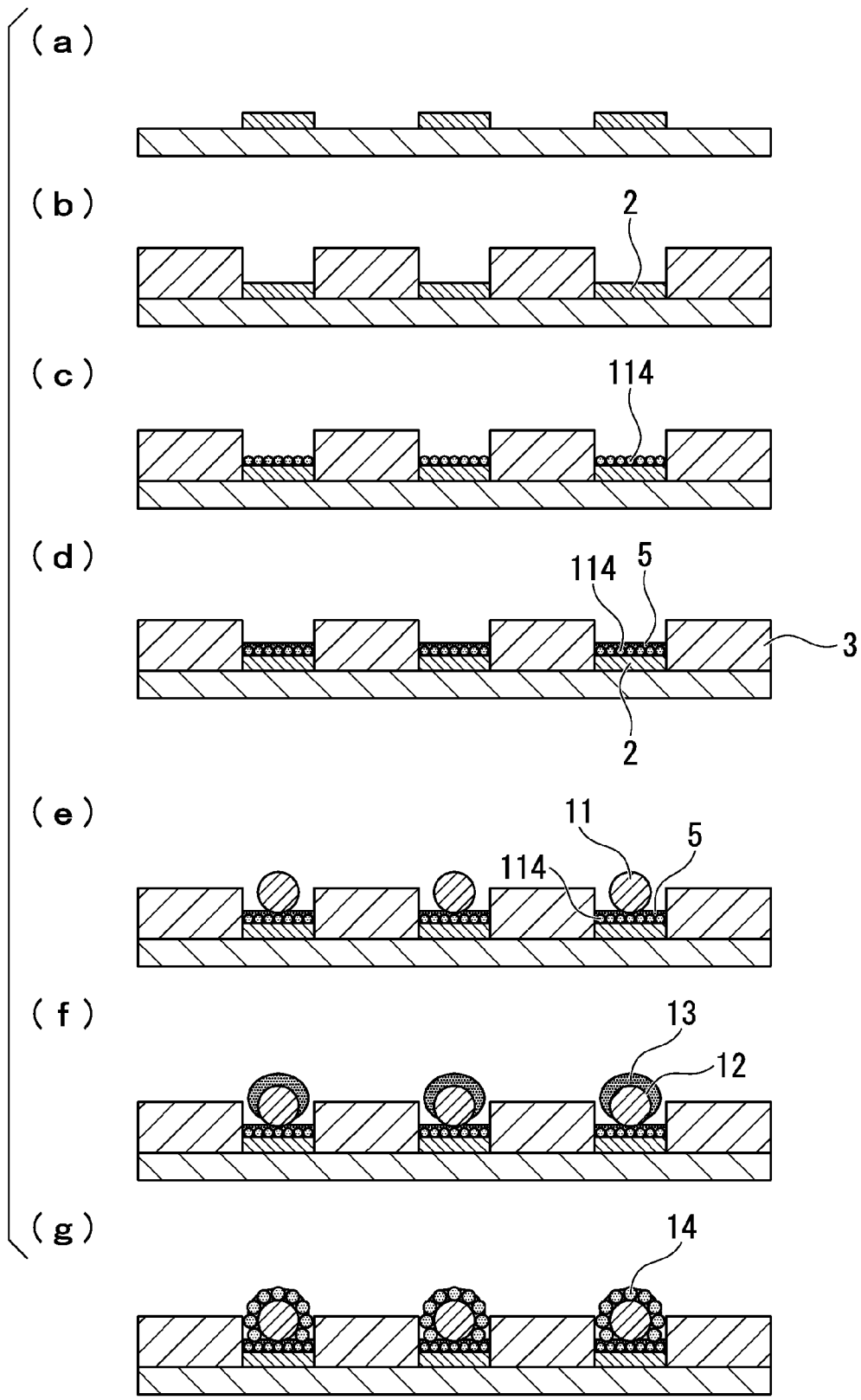
FIG. 6 is a process drawing illustrating a process of producing a circuit board that is a fourth embodiment of the present invention.

The present embodiment is different from the first embodiment in that after the second solder particles 114 are attached onto the terminal portion 2 as shown in FIG. 6(c), the first adhesive layer 5, the core body 11, and the second adhesive layer 13 are sequentially formed. Hereinafter, the detailed descriptions thereof will be made.

First, as shown in FIGS. 6(a) to 6(b), the terminal portion 2 is opened. The steps performed to this point are the same as those in the first embodiment, so the detailed descriptions thereof will be omitted. Thereafter, as shown in FIG. 6(c), an adhesive portion (not shown) is formed on the surface 4 of the terminal portion 2. Subsequently, through the adhesive portion, the second solder particles 114 are attached so as to cover the surface 4 of the terminal portion 2.

At this time, the average particle size of the second solder particles 114 is from 1 μm to 0.5 times the average particle size D of the core body 11, desirably smaller than the average particle size E of the first solder particles 14, and preferably in a range from 5 μm to 10 μm. If the particle size of the second solder particles 114 is in this range, a sufficient amount of the second solder particles 114 can enter in between the first solder particles 14 and the first adhesive layer 5. In addition, if the particle size of the second solder particles 114 is in this range, it is possible to form the solder bump 16 described later in a uniform size.

On the other hand, if the particle size of the second solder particles 114 is smaller than 1 μm, the molten solder is not sufficiently spread between the core body 11 and the terminal portion 2 in the next reflow step. If the particle size of the second solder particles 114 exceeds 0.5 times the average particle size E of the first solder particles 14, the molten solder spreads too much between the core body 11 and the terminal portion 2 in the next reflow step, which is not preferable since the solder bump 16 described later shows variations in its size.

Subsequently, as shown in FIG. 6(d), the first adhesive layer 5 is formed so as to cover the surface 4 of the terminal portion 2 and the second solder particles 114. Since the formation method of the first adhesive layer 5 is the same as that in the first embodiment, the detailed description thereof will be omitted herein.

Thereafter, as shown in FIG. 6(e), after the core body 11 is attached onto the terminal portion 2 through the first adhesive layer 5, the second adhesive layer 13 is formed so as to cover the core body 11, as shown in FIG. 6(f). Subsequently, as shown in FIG. 6(g), the first solder particles 14 are attached to the surface 12 of the core body 11 through the second adhesive layer 13. The steps performed to this point are the same as those in the first embodiment, so the detailed descriptions thereof will be omitted herein.

Next, the core body 11, the first solder particles 14, and the second solder particles 114 are fixed. Thereafter, the first solder particles 14 and the second solder particles 114 are melted by reflow, thereby forming the solder layer 15. Subsequently, the same steps as those in the first embodiment are performed, thereby forming the circuit board 1 of the present embodiment.

According to the method of producing the circuit board 1 of the present embodiment, since the core body 11 is disposed on the second solder particles 114, it is possible to firmly fix the second solder particles 114 to the core body 11 in the fixing step. As a result, it is possible to prevent the detachment of the core body 11 during the reflow. In addition, since it is possible to reliably spread the molten second solder particles 114 between the core body 11 and the terminal portion 2 during the reflow, it is possible to reliably connect the core body 11 to the terminal portion 2.

Fifth Embodiment

Hereinafter, the method of producing the circuit board 1 as the fifth embodiment of the present invention will be described with reference to drawings.

Figure 7:
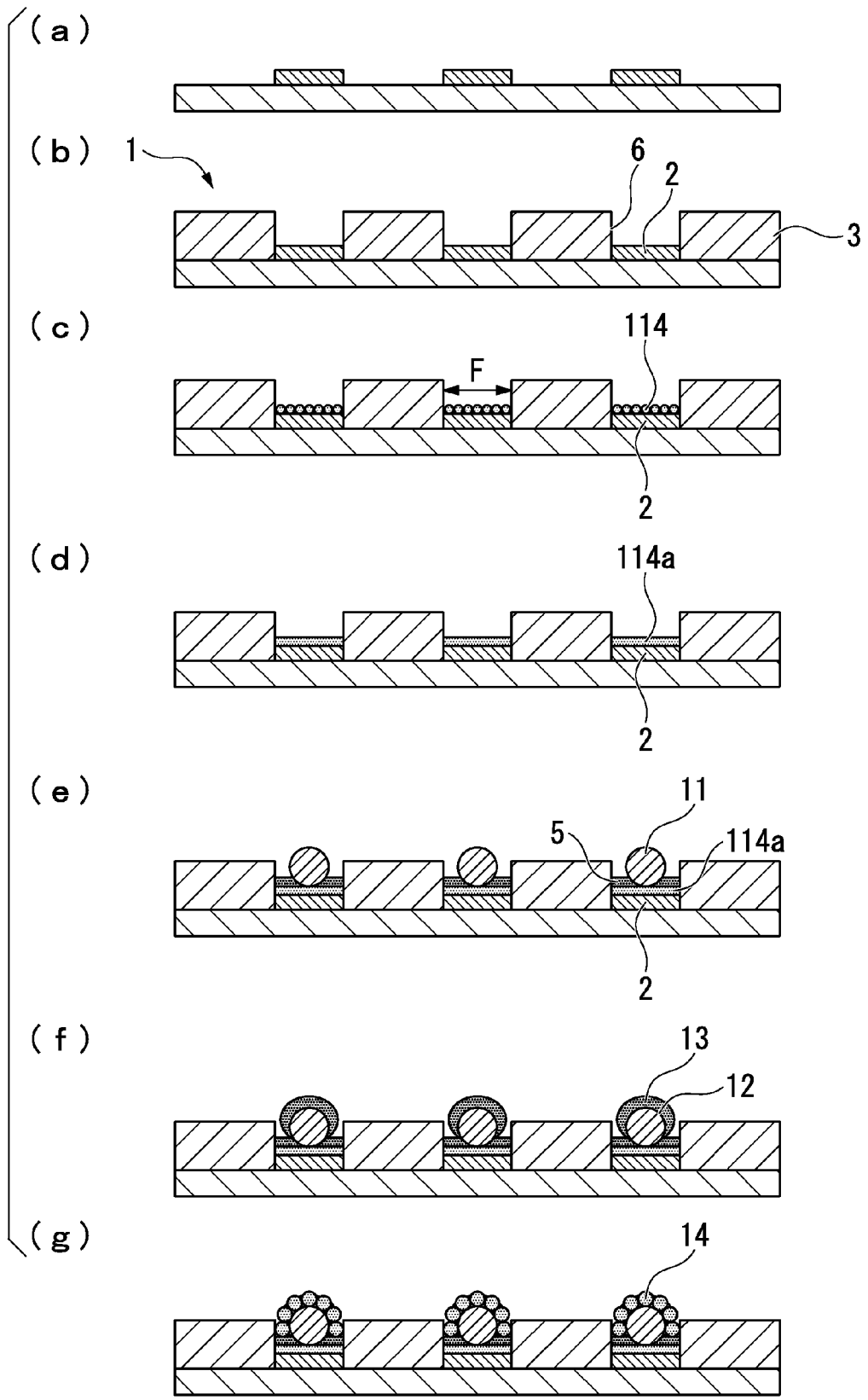
FIG. 7 is a process drawing illustrating a process of producing a circuit board that is a fifth embodiment of the present invention.

The present embodiment is different from the first embodiment in that after the second solder particles 114 are attached onto the terminal portion 2 as shown in FIG. 7(c), a solder film 114a is formed by the reflow of the second solder particles 114, and then the first adhesive layer 5, the core body 11, and the second adhesive layer 13 are sequentially formed. Hereinafter, the detailed descriptions thereof will be made.

First, as shown in FIGS. 7(a) to 7(b), the terminal portion 2 is opened. The steps performed to this point are the same as those in the first embodiment, so the detailed descriptions thereof will be omitted. Thereafter, an adhesive portion (not shown) is formed on the surface 4 of the terminal portion 2. Subsequently, through the adhesive portion, the second solder particles 114 are attached so as to cover the surface 4 of the terminal portion 2. This state is shown in FIG. 7(c).

At this time, the average particle size of the second solder particles 114 is preferably from 1 μm to a third of a diameter F of the terminal portion 2. If the particle size of the second solder particles 114 is in this range, it is possible to form the solder film 114a that has a sufficiently smooth surface.

On the other hand, if the particle size of the second solder particles 114 is smaller than 1 μm, the molten solder is not sufficiently spread between the core body 11 and the terminal portion 2 in the next reflow step. If the particle size of the second solder particles 114 exceeds a third of the diameter F of the terminal portion 2, the solder film 114a having a surface that is swollen to a convex shape is formed in the next reflow step. Accordingly, it is difficult for the core body 11 to be attached in the later steps, which is thus not preferable.

Next, as shown in FIG. 7(d), the second solder particles 114 are caused to reflow. As a result, the solder film 114a is formed so as to cover the surface 4 of the terminal portion 2.

At this time, the solder film 114a can be formed not only by a super just fit method (a method of causing the solder powder that is attached through the adhesive layer to reflow) described above, but by plating. When the solder film 114a is formed by plating, the thickness of the solder film 114a can be set to about 3 μm. In order to stably accomplish the improvement of the fixing property in the fixing step in the present embodiment, the thickness is preferably 0.5 μm or more. If the thickness is 1 μm or more, the fixing can be more stably performed, which is thus preferable. The upper limit of the thickness does not directly affect the fixing property in the fixing step, but the thickness is preferably 10 μm or less from an economic point of view. In this manner, it is possible to form the solder film 114a in a uniform thickness. Accordingly, it is possible to form the solder bump 16 with a uniform height.

Thereafter, as shown in FIG. 7(e), the first adhesive layer 5 is formed so as to cover the solder film 114a, and the core body 11 is attached onto the terminal portion 2 through the first adhesive layer 5 and the solder film 114a. Since the method of forming the first adhesive layer 5 is the same as that in the first embodiment, the detailed description thereof will be omitted herein.

Subsequently, as shown in FIG. 7(e), after the core body 11 is attached onto the terminal portion 2 through the first adhesive layer 5, the second adhesive layer 13 is formed so as to cover the core body 11, as shown in FIG. 7(f). Thereafter, as shown in FIG. 7(g), the first solder particles 14 are attached to the surface 12 of the core body 11 through the second adhesive layer 13. Since these steps are the same as those in the first embodiment, the detailed descriptions thereof will be omitted herein.

Next, the core body 11, the first solder particles 14, and the second solder particles 114 are fixed. Thereafter, the first solder particles 14 and the solder film 114a are melted by reflow, thereby forming the solder layer 15. Subsequently, the same steps as those in the first embodiment are performed, thereby forming the circuit board 1 of the present embodiment.

According to the method of producing the circuit board 1 of the present embodiment, the core body 11 is disposed on the solder film 114a. Accordingly, it is possible to firmly fix the solder film 114a to the core body 11 in the fixing step. Consequently, it is possible to prevent the core body 11 from being detached during the reflow. In addition, since it is possible to reliably spread the molten solder film 114a between the core body 11 and the terminal portion 2 during the reflow, it is possible to reliably connect the core body 11 to the terminal portion 2.

All of these production methods prevent the detachment of the core body 11 and have an effect of improving yield. The one to be selected from these methods may be appropriately determined depending on the type, shape, electrode size, and the like of the circuit board to be used, since the thermal history or the like of the circuit board varies depending on the steps.

Sixth Embodiment

Hereinafter, the method of producing the circuit board 1 as the sixth embodiment of the present invention will be described with reference to drawings. The present embodiment is different from the first embodiment in that after a first solder particles-attached core body 30 is formed in advance in the step of the present invention, the first solder particles-attached core body 30 is attached onto the first adhesive layer 5. Accordingly, only the different part will be described in the following description, and the descriptions of the whole steps are omitted.

First, by using the second adhesiveness-imparting compound, the adhesiveness is imparted on the surface 12 of the core body 11, thereby forming the second adhesive layer 13. Thereafter, in the air, in an inert gas atmosphere, or in the dispersion 41 including the first solder particles 14, the first solder particles 14 are attached to the second adhesive layer 13, thereby forming the first solder particles-attached core body 30 shown in FIG. 8(a). The first solder particles-attached core body 30 is configured with the second adhesive layer 13 formed on the surface 12 of the core body 11 and the first solder particles 14 attached to the surface 12 of the core body 11 through the second adhesive layer 13.

In the present embodiment, it is preferable to perform the step of forming the second adhesive layer 13 on the surface 12 of the core body 11 in the air, and to perform the step of attaching the first solder particles 14 to the second adhesive layer 13 in the dispersion 41.

Figure 8:
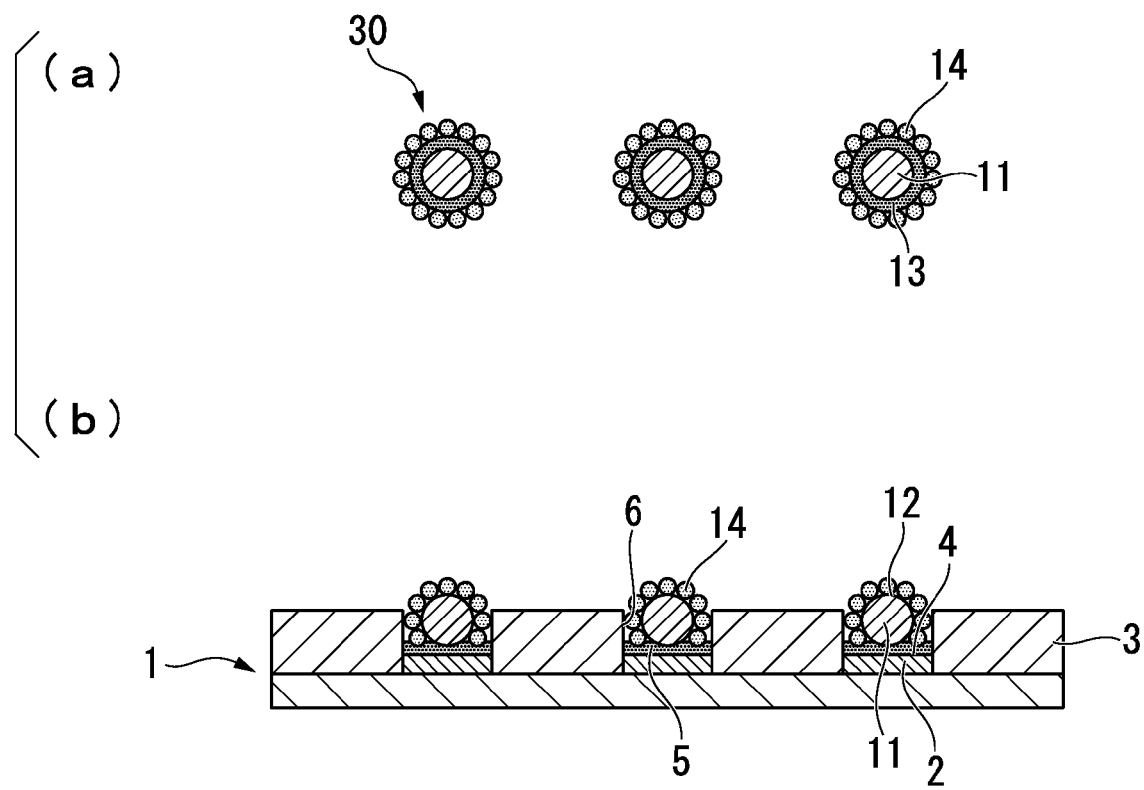
FIG. 8 is a process drawing illustrating a process of producing a circuit board that is a sixth embodiment of the present invention.

Subsequently, in the same manner as the steps shown in FIGS. 1(a) to 1(c) of the first embodiment, the first adhesive layer 5 is formed so as to cover the surface of the terminal portion 2 of the circuit board 1. Thereafter, as shown in FIG. 8(b), the first solder particles-attached core body 30 formed in advance is attached to the first adhesive layer 5. The method thereof will be described hereinafter.

First, the method of attaching the first solder particles-attached core body 30 in the air or the inert gas atmosphere will be described. First, the first solder particles-attached core body 30 is introduced to a container filled with the air or inert gas, and then the circuit board 1 in which the first adhesive layer 5 has been formed is installed in the container. Subsequently, the container is tilted or vibrated, thereby bringing the first adhesive layer 5 into contact with the first solder particles-attached core body 30. As a result, the first solder particles-attached core body 30 is attached to the first adhesive layer 5.

Next, a method of attaching the first solder particles-attached core body 30 in liquid will be described. First, as shown in FIG. 3, the dispersion 41 such as water is introduced to the container 40, and the first solder particles-attached core body 30 is added to the dispersion 41. Thereafter, the container 40 is tilted so as to tilt the dispersion 41 and the first solder particles-attached core body 30 to one side, and the circuit board 1 is installed inside the container while being kept out of contact with the dispersion 41 and the first solder particles-attached core body 30. Subsequently, the container 40 is tilted to the left and right sides, whereby the first adhesive layer 5 contacts the first solder particles-attached core body 30 in the dispersion 41. In this manner, the first solder particles-attached core body 30 is attached to the first adhesive layer 5.

Thereafter, the first solder particles 14 are melted in the same manner as the steps shown in FIGS. 2(a) to 2(d) of the first embodiment, thereby forming the solder layer 15 on the surface 12 of the core body 11. Subsequently, the electronic component 22 is mounted on the circuit board 1.

According to the production method of the present embodiment, the following effects are obtained in addition to the same effects as those obtained in the case of the first embodiment.

That is, according to the method of producing the circuit board 1 of the present embodiment, after the first solder particles-attached core body 30 is attached to the terminal portion 2, the first solder particles 14 are heated and melted. As a result, it is possible to form the solder layer 15 on the surface 12 of the core body 11, and the steps can be greatly simplified compared to the case of using the solder-attached core body that has a surface plated with solder.

Moreover, when the electronic component 22 or the like is mounted, the core body 11 serves as a spacer, and as a result, it is possible to mount the electronic component without slanting the posture of the electronic component 22.

Furthermore, since the first adhesive layer 5 is formed after the resist layer 3 having the opening portions 6 is formed on the circuit board 1, the first adhesive layer 5 is not formed in portions other than the terminal portion 2. As a result, it is possible to selectively attach the first solder particles-attached core body 30 to the terminal portion 2. In addition, since the first solder particles-attached core body 30 is attached to the inside of the opening portion 6, even when the adhesive force of the first adhesive layer 5 is weak, it is possible to prevent the first solder particles-attached core body 30 from being detached outside the opening portion 6. Consequently, it is possible to reliably attach the first solder particles-attached core bodies 30 to all terminal portions 2.

In addition, by attaching the first solder particles-attached core body 30 to the first adhesive layer 5 in the dispersion 41 including the first solder particles-attached core body 30, it is possible to attach a uniform amount of the first solder particles-attached core body 30 to the respective terminal portion 2. As a result, for example, it is also possible to reliably attach one first solder particles-attached core body 30 to one terminal portion 2.

Moreover, by attaching the first solder particles 14 to the second adhesive layer 13 in the dispersion 41 including the first solder particles 14, it is possible to attach a uniform amount of the first solder particles 14 to the respective core body 11. In addition, compared to the case of forming the solder layer on the surface of the core body by plating or the like, it is possible to greatly simplify the steps.

EXAMPLES

Hereinafter, the present invention will be described based on examples, but the present invention is not limited thereto.

Example 1

First, as the core body 11, a ball having a particle size of 50 μm and formed of pure Cu was prepared. Subsequently, the circuit board 1 in which about 1000 terminal portions 2 having a diameter of 80 μm and formed of copper were arranged was prepared, and the insulating resist layer 3 having a thickness of 20 μm was formed using a general photolithography method. In this manner, the circular opening portion 6 that was part of a configuration for exposing the terminal portion 2 and had a diameter of 80 μm was formed. Thereafter, as an adhesive solution including the first adhesiveness-imparting compound, 2% by mass of an aqueous imidazole-based compound solution in which the alkyl group of R12 of General Formula (3) was $C_{11}H_{23}$, and R11 was a hydrogen atom was prepared and adjusted to about pH 4 by acetic acid. Then the adhesive solution was warmed at 40° C., and the circuit board 1 that had been pre-treated with an aqueous hydrochloric acid solution was dipped into the adhesive solution for 3 minutes, thereby forming the first adhesive layer 5 so as to cover the surface 4 of the terminal portion 2.

Thereafter, a particle-attaching device that had internal dimensions of 200 mm×120 mm×150 mm was prepared. This particle-attaching device was provided with the container 40 having an input port and had a configuration in which the circuit board 1 could be input in a horizontal direction. 1600 ml of water and about 400 g of the core body 11 formed of copper and having an average particle size of 50 μm were introduced to the container 40. Subsequently, the particle-attaching device was tilted so as to tilt the water and core body 11 to one side in the container 40, and then the circuit board 1 was dipped in the container 40 while being kept out of contact with the core body 11. After that, the container 40 was tilted to the left and right sides at 30° for 30 to 60 seconds, whereby the core body 11 was attached to the circuit board 1 through the first adhesive layer 5. At this time, the period of tilting was set to 10 sec/tilt.

Thereafter, the circuit board 1 was taken out of the device, followed by gentle washing with pure water, and then dried.

Subsequently, by using again the adhesiveness-imparting compound described above, the second adhesive layer 13 was formed on the surface 12 of the core body 11.

Next, 1600 ml of water and 400 g of the first solder particles 14 that had a composition of 96.5 Sn/3.5 Ag and an average particle size of 10 μm were input in the particle-attaching device. Subsequently, the particle-attaching device was tilted so as to tilt the water and the first solder particles 14 to one side in the container 40, and then the circuit board 1 was dipped in the container while being kept out of contact with the first solder particles 14. After that, the container 40 was tilted to the left and right sides at 30° for 30 to 60 seconds, whereby the first solder particles 14 were attached to the core body 11 through the second adhesive layer 13. At this time, the period of tilting was set to 5 sec/tilt.

Thereafter, the circuit board 1 was taken out of the device, followed by gentle washing with pure water, and then dried.

Subsequently, the circuit board 1 was put in an oven at 180° C. and heated for 20 minutes, thereby fixing the core body 11 and the first solder particles 14. Next, a flux was applied by being sprayed to the surface of the circuit board 1, and the circuit board 1 was introduced to a reflow furnace so as to be heated at 240° C. in a nitrogen atmosphere for 3 minutes, thereby forming the solder bump 16 having a height of about 53 μm on the terminal portion 2.

As a result, the variation of the height of the solder bump 16 was 1.5 μm in a standard deviation, which was almost the same as the variation of the particle size of the core body 11. In addition, the terminal portion 2 to which the solder bump 16 had not been attached was not found.

Example 2

The steps to a point where the first solder particles 14 were attached to the core body 11 were performed under the same conditions as in Example 1, except that the particle size of the core body 11 was set to 50 μm, and the particle size of the first solder particles 14 was set to 20 μm.

Thereafter, by the same steps, the second solder particles 114 having a particle size of 10 μm were attached to the terminal portion 2 in water through the second adhesive layer 13.

Subsequently, washing, drying, and reflow were performed in the same manner as in Example 1, thereby producing the solder bump 16.

Example 3

The particle size of the core body 11 was set to 50 μm, and the steps to a point where the core body 11 was attached to the first adhesive layer 5 were performed in the same manner as in Example 1.

Thereafter, the second solder particles 114 having a particle size 5 μm were attached to the first adhesive layer 5 in the air. Subsequently, the first solder particles 14 were attached to the core body 11 in water under the same conditions as in Example 1, except that the particle size of the first solder particles 14 was set to 20 μm.

Subsequently, washing, drying, and reflow were performed in the same manner as in Example 1, thereby producing the solder bump 16.

Example 4

After the resist layer 3 and the opening portion 6 having a configuration for exposing the terminal portion 2 were formed in the same manner as in Example 1, the second solder particles 114 having a particle size of 10 μm were attached through the adhesive portion so as to cover the surface 4 of the terminal portion 2. Thereafter, the solder bump 16 was produced under the same conditions as in Example 1, except that the particle size of the core body 11 was set to 50 μm, and the particle size of the first solder particles 14 was set to 20 μm.

Example 5

After the resist layer 3 and the opening portion 6 having a configuration for exposing the terminal portion 2 were formed in the same manner as in Example 1, the second solder particles 114 having a particle size of 10 μm were attached through the adhesive portion so as to cover the surface 4 of the terminal portion 2. Thereafter, the solder bump 16 was produced under the same conditions as in Example 1, except that the particle size of the core body 11 was set to 50 μm, and the particle size of the first solder particles 14 was set to 20 μm.

Example 6

After the resist layer 3 and the opening portion 6 having a configuration for exposing the terminal portion 2 were formed in the same manner as in Example 1, a tin alloy plating having a thickness of 3 μm was formed by non-electrolytic plating so as to cover the terminal portion 2. Thereafter, the solder bump 16 was produced under the same conditions as in Example 1, except that the particle size of the core body 11 was set to 50 μm, and the particle size of the first solder particles 14 was set to 20 μm.

As can be seen from the results of Examples 2 to 6, regarding the solder bump 16, the core body 11 was not detached during the fixing step and the reflow step in any of the examples, and no terminal portion 2 to which the solder bump 16 was not attached was found.

INDUSTRIAL APPLICABILITY

The solder bump formed in the present method can be formed without using a high melting point solder including a large amount of lead. Accordingly, it is possible to realize a lead-free solder, and to solve the problem of the malfunction caused by an α ray emitted from the Pb isotope. In addition, it is possible to create a solder bump having the core body in the core thereof, without using an expensive copper core solder ball. Accordingly, it is possible to solve the problem of the the height of the solder bump becoming uneven, and the chip sinking at the time of reflow when the chip is mounted, at a low cost. The present method is suitable for a fine circuit board, and can provide an electronic instrument having a high degree of integration and high reliability.

REFERENCE SIGNS LIST

1 . . . CIRCUIT BOARD
1a . . . UPPER SURFACE OF CIRCUIT BOARD
2 . . . TERMINAL PORTION
3 . . . RESIST LAYER
4 . . . SURFACE OF TERMINAL PORTION
5 . . . FIRST ADHESIVE LAYER
6 . . . OPENING PORTION
11 . . . CORE BODY
12 . . . SURFACE OF CORE BODY
13 . . . SECOND ADHESIVE LAYER
14 . . . FIRST SOLDER PARTICLE
15 . . . SOLDER LAYER
16, 20 . . . SOLDER BUMP
22 . . . ELECTRONIC COMPONENT
23 . . . ELECTRONIC COMPONENT BODY
24 . . . TERMINAL PORTION OF ELECTRONIC COMPONENT
25 . . . PLATING LAYER
30 . . . FIRST SOLDER PARTICLES-ATTACHED CORE BODY
40 . . . CONTAINER
41 . . . DISPERSION
114 . . . SECOND SOLDER PARTICLE
114a . . . SOLDER FILM

The invention claimed is:

1. A method of producing a circuit board comprising steps of:
   forming a first adhesive layer by applying a first adhesiveness-imparting compound on a surface of terminal portions of a circuit board;
   attaching a core body on the first adhesive layer of the terminal portions;
   forming a second adhesive layer by applying a second adhesiveness-imparting compound on a surface of the core body;
   attaching first solder particles on the second adhesive layer of the surface of the core body; and
   forming a solder layer on the surface of the core body by melting the first solder particles.

2. The method of producing a circuit board according to claim 1, further comprising steps of:
   attaching the first solder particles-attached core body to the first adhesive layer, wherein the first solder particles-attached core body is the core body in which the first solder particles are attached to the surface thereof through the second adhesive layer.

3. The method of producing a circuit board according to claim 2,
   wherein the circuit board having the first adhesive layer is dipped into a dispersion including the first solder particles-attached core body so that the first solder particles-attached core body is attached to the first adhesive layer.

4. The method of producing a circuit board according to claim 2,
   wherein the core body having the second adhesive layer is dipped into the dispersion including the first solder particles, so that the first solder particles are attached to the second adhesive layer and the first solder particle-attached core body is formed.

5. The method of producing a circuit board according to claim 1, further comprising a step of attaching second solder particles to the surface of the terminal portion through the first adhesive layer, after the step of attaching the first solder particles to the second adhesive layer,
   wherein in the step of forming the solder layer, the first and second solder particles are melted.

6. The method of producing a circuit board according to claim 5,
   wherein the average particle size of the second solder particles is from 1 μm to 0.4 times the average particle size of the first solder particles.

7. The method of producing a circuit board according to claim 1, further comprising a step of attaching second solder particles to the surface of the terminal portion through the first adhesive layer, between the step of attaching the core body to the first adhesive layer and the step of forming the second adhesive layer,
   wherein in the step of forming the solder layer, the first and second solder particles are melted.

8. The method of producing a circuit board according to claim 7,
   wherein the average particle size of the second solder particles is from 1 μm to 0.5 times the average particle size of the core body and is smaller than the first solder particles.

9. The method of producing a circuit board according to claim 8,
   wherein the average particle size of the second solder particles is 5 μm to 10 μm.

10. The method of producing a circuit board according to claim 1, further comprising a step of attaching second solder particles to the surface of the terminal portion, before the step of forming the first adhesive layer,
wherein in the step forming the solder layer, the first and second solder particles are melted.

11. The method of producing a circuit board according to claim 10,
wherein the average particle size of the second solder particles is from 1 μm to 0.5 times the average particle size of the core body and is smaller than the first solder particles.

12. The method of producing a circuit board according to claim 11,
wherein the average particle size of the second solder particles is 5 μm to 10 μm.

13. The method of producing a circuit board according to claim 1, further comprising steps of:
attaching second solder particles to the surface of the terminal portion;
forming a solder film on the surface of the terminal portion by melting the second solder particles; and
forming the first adhesive layer by applying the first adhesiveness-imparting compound to the surface of the terminal portion through the solder film,
wherein in the step of forming the solder layer, the first solder particles and the solder film are melted.

14. The method of producing a circuit board according to claim 13,
wherein the average particle size of the second solder particles is from 1 μm to a third of the diameter of the terminal portion.

15. The method of producing a circuit board according to claim 1, further comprising steps of:
forming a solder film on the surface of the terminal portion by plating; and
forming the first adhesive layer by applying the first adhesiveness-imparting compound to the surface of the terminal portion through the solder film,
wherein in the step of forming the solder layer, the first solder particles and the solder film are melted.

16. The method of producing a circuit board according to claim 1,
wherein the circuit board having the first adhesive layer is dipped into a dispersion including the core body so that the core body is attached to the first adhesive layer.

17. The method of producing a circuit board according to claim 1,
wherein the circuit board to which the core body having the second adhesive layer has been attached is dipped into a dispersion including the first solder particles so that the first solder particles are attached to the surface of the core body.

18. The method of producing a circuit board according to claim 1,
wherein a metal ball is used as the core body.

19. The method of producing a circuit board according to claim 1,
wherein the core body is formed of copper.

20. The method of producing a circuit board according to claim 1,
wherein in the step of forming the first adhesive layer, an insulating layer having an opening portion for exposing the terminal portion is formed on the circuit board, and then the first adhesive layer is formed.

* * * * *

UNITED STATES PATENT AND TRADEMARK OFFICE
CERTIFICATE OF CORRECTION

PATENT NO. : 9,078,382 B2  
APPLICATION NO. : 13/266310  
DATED : July 7, 2015  
INVENTOR(S) : Takashi Shoji and Takekazu Sakai Page 1 of 1

It is certified that error appears in the above-identified patent and that said Letters Patent is hereby corrected as shown below:

ON THE TITLE PAGE

Delete "(73) Assignee: SHOW A DENKO K.K., Tokyo (JP)"

Insert --(73) Assignee: SHOWA DENKO K.K., Tokyo (JP)--

Signed and Sealed this  
Twenty-sixth Day of January, 2016

Michelle K. Lee  
*Director of the United States Patent and Trademark Office*